United States Patent [19]

Kokado

[11] Patent Number: 4,877,977
[45] Date of Patent: Oct. 31, 1989

[54] ECL CIRCUIT HAVING AN IMPROVED EMITTER FOLLOWER OUTPUT CIRCUIT

[75] Inventor: Masayuki Kokado, Machida, Japan
[73] Assignee: Fujitsu Limited, Kawasaki, Japan
[21] Appl. No.: 199,637
[22] Filed: May 27, 1988

[30] Foreign Application Priority Data

Jun. 2, 1987 [JP] Japan .................................. 62-138443

[51] Int. Cl.⁴ ........................ H03K 19/086; H03K 3/01
[52] U.S. Cl. .................................... 307/455; 307/443;
307/263; 307/270; 307/355
[58] Field of Search ............... 307/455, 270, 443, 263,
307/467, 557, 254, 567, 542, 355, 360, 362

[56] References Cited

U.S. PATENT DOCUMENTS

| | | | |
|---|---|---|---|
| 4,237,387 | 12/1980 | Devendorf et al. | 307/455 |
| 4,276,485 | 6/1981 | Rydval | 307/463 |
| 4,539,493 | 9/1985 | Varadarajan | 307/455 |
| 4,559,458 | 12/1985 | Ma | 307/254 |
| 4,628,216 | 12/1986 | Mazumder | 307/467 |
| 4,675,554 | 6/1987 | Koury, Jr. et al. | 307/455 |
| 4,678,942 | 7/1987 | Kanai et al. | 307/443 |
| 4,687,953 | 8/1987 | Varadaraan | 307/270 |
| 4,745,304 | 5/1988 | Wilson | 307/455 |

Primary Examiner—Stanley D. Miller
Assistant Examiner—Timothy P. Callahan
Attorney, Agent, or Firm—Armstrong, Nikaido, Marmelstein, Kubovcik & Murray

[57] ABSTRACT

A semiconductor integrated circuit having an emitter follower circuit coupled with an output of a logic circuit includes the following. A first emitter follower circuit receives an output signal of a logic circuit such as an emitter coupled logic circuit. An output signal obtained at an emitter output of the first emitter follower circuit forms a finalized output signal of the logic circuit. A second emitter follower circuit receives a signal in phase with the output signal of the logic circuit. A detecting circuit detects a difference in level between the output signal of the first emitter follower circuit and an output signal of the second emitter follower circuit. A driving circuit drives a load capacitance coupled with the emitter output of the first emitter follower circuit during a period when the detecting circuit detects the difference.

12 Claims, 4 Drawing Sheets

ECL CIRCUIT HAVING AN IMPROVED EMITTER FOLLOWER OUTPUT CIRCUIT

BACKGROUND OF THE INVENTION

The present invention generally relates to a semiconductor integrated circuit having an emitter follower circuit. The present invention may be suitably used as an output circuit of an emitter coupled logic circuit capable of driving a load having a large capacity.

It is well known that an emitter follower circuit is used as an output circuit of an emitter coupled logic (hereafter simply referred to as ECL). The emitter follower circuit is a low impedance circuit. Therefore as long as a signal is applied to a base terminal of a transistor which constitutes the emitter follower circuit, a current supply is available to an output line with which a load capacitor is coupled. When a potential level at the base terminal of the emitter follower transistor is switched from a low level (hereafter simply referred to as "L") to a high level (hereafter simply referred to "H"), the emitter follower transistor can charge the load capacity at a high speed. On the other hand, when the level of the base terminal of the emitter follower transistor is switched from "H" to "L", a capacity stored in the load capacitor is allowed to be discharged through a resistor connected to an emitter terminal thereof. In this operation, a discharging time necessary for completely discharging the capacity stored in the load capacitor depends on a time constant which is a product of the resistance of the resistor and the capacitance of the load capacitor. For this reason, as the time constant becomes large, the discharging time is increased.

In order to reduce the above problem, an improved ECL circuit has been proposed in the U.S. Pat. No. 4,539,493. The proposed ECL circuit having an emitter follower circuit positively utilizes a fact that when the output of the ECL circuit is switched from "H" to "L", a reverse logic output is switched from "L" to "H", as will be described in detail later. The level change of the reverse logic output is supplied to the base terminal of the emitter follower transistor through a capacitive coupling. Thereby, the base level of the emitter follower transistor is increased, so that the change from "H" to "L" can be facilitated.

However, as will be also described later, the proposed ECL circuit has the following disadvantages. First, although the switching speed of the emitter follower circuit has been increased, it still considerably depends on the load capacitance. It is to be noted that the load capacitance is varied depending on a circuit design and a circuit scale. Therefore, it is very difficult to obtain desired characteristics of the ECL circuit. Secondly, the proposed ECL circuit is apt to be affected by a parastic capacitance coupled with the circuit. Thirdly, it is very difficult to adjust the circuit to obtain desired characteristics.

Yet another ECL circuit has been proposed in the U.S. Pat. No. 4,276,485 in which the reverse output is supplied to the base terminal of the emitter follower transistor through a resistor. The ECL circuit described in the latter publication has also disadvantages similar to those for the former publication.

SUMMARY OF THE INVENTION

Accordingly, a general object of the present invention is to provide a novel and useful semiconductor integrated circuit having an emitter follower circuit in which the above disadvantages have been eliminated.

A more specific object of the present invention is to provide a semiconductor integrated circuit having an emitter follower circuit capable of switching its output at a higher speed.

Another object of the present invention is to provide a semiconductor integrated circuit having an emitter follower circuit in which desired characteristics can be easily obtained.

The above objects of the present invention can be achieved by a semiconductor integrated circuit having an emitter follower circuit comprising the following. A first emitter follower circuit receives an output signal of a logic circuit such as an emitter coupled logic circuit. An output signal obtained at an emitter output of the first emitter follower circuit forms a finalized output signal of the logic circuit. A second emitter follower circuit receives a signal in phase with the output signal of the logic circuit. A detecting circuit detects a difference in level between the output signal of the first emitter follower circuit and an output signal of the second emitter follower circuit. A driving circuit drives a load capacitance coupled with the emitter output of the first emitter follower circuit during a period when the detecting circuit detects the difference.

Other objects, features and advantages of the present invention will become apparent from the following detailed description when read in conjunction with the accompanying drawings.

DETAILED DESCRIPTION

Figure 1:
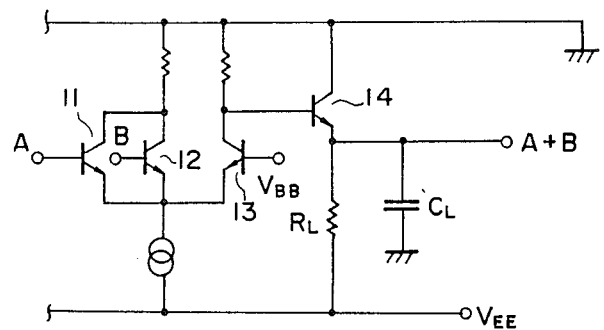
FIG. 1 is a circuit diagram of a conventional ECL circuit having an emitter follower transistor.
Figure 2:
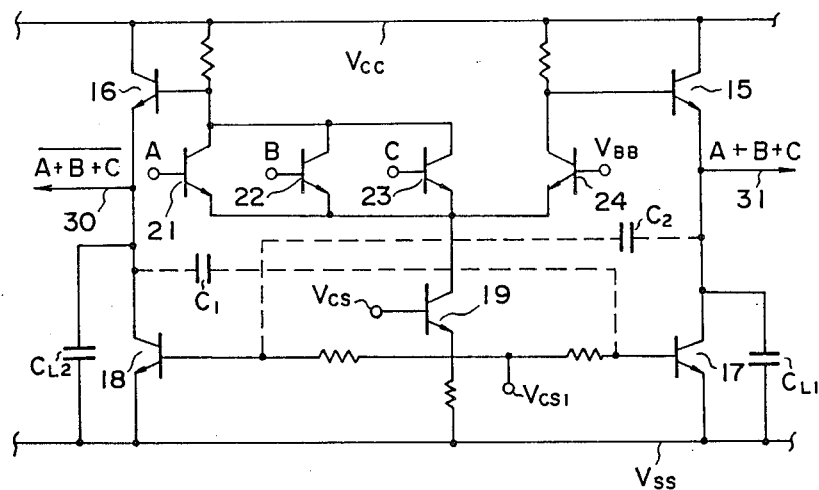
FIG. 2 is a circuit diagram of another conventional ECL circuit having an emitter follower which is designed so as to overcome advantages of the circuit shown in FIG. 1.

To facilitate understanding of the present invention, a brief reference is made to conventional arts with reference to FIGS. 1 and 2.

Referring to FIG. 1 illustrating a conventional ECL circuit having a two-input OR logic function, two input signals A and B are applied to base terminals of npn-type transistors 11 and 12. A reference potential $V_{BB}$ is applied to a base terminal of npn-type transistor 13. Collector terminals of the transistors 11 and 12 are connected to each other, and emitter terminals thereof are also connected to each other. The three transistors 11, 12 and 13 constitute a logic circuit portion of the ECL circuit. An npn-type transistor 14 is an emitter follower and constitutes an output portion of the ECL circuit. The base terminal of the transistor 14 is connected to the collector terminal of the transistor 13, and the emitter terminal thereof is coupled with a load capacitor $C_L$ and a resistor $R_L$ which are an output load.

In operation, when the output of the ECL circuit is switched from "L" to "H", the transistor 14 charges the load capacitor $C_L$ and therefore the switching speed of the emitter follower is very high. On the other hand, when the output is changed from "H" to "L", the charge stored in the load capacitor $C_L$ is discharged through the resistor $R_L$. Therefore, in the case where a time constant which is a product of the resistance of the resistor $R_L$ and capacitance of the capacitor $C_L$ is large, the speed of switching from "H" to "L" is slow. In particular, it is very difficult to obtain the resistor $R_L$ having a small resistance in view of recent tendency in which the integration density or level is improved and low power consumption is desired. Additionally, signal lines formed on a LSI chip are lengthened, and therefore the capacitance of the load capacitor $C_L$ is increased.

A conventional ECL circuit shown in FIG. 2 intends to reduce the above problems. The illustrated ECL circuit has been disclosed in the former publication described before. This proposal utilizes the change in the reverse logic output from "L" to "H" obtained when the output of the circuit is switched from "H" to "L". Three input signals A, B and C are applied to base terminals of npn-type transistors 21, 22 and 23. The reference potential $V_{BB}$ is applied to the base terminal of an npn-type transistor 24. An npn-transistor 15 is an emitter follower, at the emitter terminal of which an OR logic output A+B+C is obtained. As described, another emitter follower which is constituted by an npn-type transistor 16 is provided. The base terminal of the transistor 16 is connected to the collector terminals of the transistors 21, 22, and 23, and a reverse logic output $\overline{A+B+C}$ is obtained at the emitter terminal of the transistor 16. The emitter terminals of the transistors 15 and 16 are connected to a $V_{SS}$ power supply line through npn-type transistors 17 and 18, respectively. Capacitors $C_{L1}$ and $C_{L2}$ are load capacitors, and a transistor 19 is a constant current source.

In operation, when one output 31 is changed from "H" to "L", the other output 30 is changed from "L" to "H". This changed signal level of the output 30 is applied to the base terminal of the transistor 17 through a capacitor C1, so that the potential thereof is increased. Thereby, a driving current (collector current) passing through the transistor 17 is increased, and thus the charge stored in the load capacitor $C_{L1}$ can be discharged at a high speed.

However, the conventional ECL circuit of FIG. 2 has the following disadvantages. First, the low-to-high switching speed of the output 30 depends on the capacity of the load capacitor $C_{L2}$, and therefore an increase in current of the transistor 17 also depends on the capacity of the load capacitor $C_{L2}$. It is to be noted that generally, the capacitance of the load capacitor such as $C_{L1}$ and $C_{L2}$ varies depending on circuit design and circuit scale. For this reason, it is very difficult to obtain desired characteristics of the ECL circuit. Secondly, the current passing through the transistor 17 can be controlled by adjusting the capacitance of the capacitor C1. However, the capacitor C1 is apt to be affected by parasitic capacitance, and therefore it is very difficult to adjust the capacitor C1 so as to obtain a desired capacitance thereof.

The present invention intends to eliminate the above problems.

Figure 3:
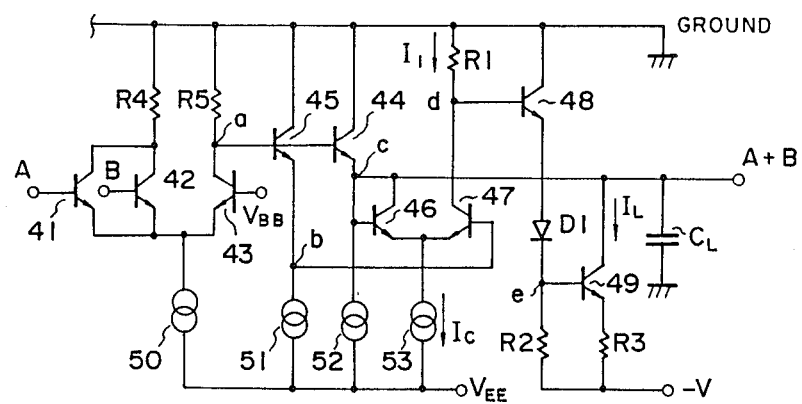
FIG. 3 is a circuit diagram of a preferred embodiment of the present invention.

A description is now given of a preferred embodiment of the present invention with reference to FIG. 3. An essential feature of the present embodiment is the presence of transistors 44, 46, 47, 48 and 49. Referring to FIG. 3, two input signals A and B are applied to base terminals of npn-type transistors 41 and 42, respectively. A reference potential $V_{BB}$ is applied to a base terminal of the transistor 43. The reference potential $V_{BB}$ is set at a constant potential between a low level and a high level at an output terminal of the circuit at which an logic output A+B is obtained. The collector terminals of the transistors 41 and 42 are connected to each other and is connected to ground GROUND (positive level in the circuit) through a resistor R4. The collector terminal of the transistor 43 is connected to the ground through a resistor R5. Emitter terminals of the transistors 41, 42 and 43 are connected to a constant current supplying circuit 50, which may be constituted by a transistor circuit. An npn-type transistor 44 forms an emitter follower circuit which plays a role of an output circuit of the ECL circuit. An output a of the transistor 43 is supplied to a base terminal of the transistor 44. An emitter terminal of the transistor 44 is coupled with a load capacitor $C_L$. Generally, the load capacitor $C_L$ is formed by a wiring capacitance and an input capacitance of a circuit of the following stage. A collector terminal of the transistor 44 is connected to the ground. The transistors 41, 42, 43 and 44 corresponds to the transistors 11, 12, 13 and 14 of FIG. 1, respectively. In addition to the transistor 44, there is provided a transistor 45 to which there is input the output a of the transistor 43.

Outputs b and c of the transistors 44 and 45 are supplied to a potential difference detecting circuit which is composed of npn-type transistors 47 and 46, respectively. The transistors 46 and 47 constitute one differential amplifier. The potential difference detecting circuit has a function of detecting a difference in potential between the outputs b and c. Base and collector terminals of the transistor 46 are connected to the emitter terminal of the transistor 44, and are also connected to a constant current supplying circuit 52. A base terminal of the transistor 47 is connected to the emitter terminal of the transistor 45, and is also connected to a constant current supplying circuit 51. Emitter terminals of the transistors 46 and 47 are connected to each other, and are also connected to a constant current supplying source 53, which is connected to an emitter supply source $V_{EE}$.

An npn-type transistor 48 is provided in order to transmit an output d of the transistor 47 to a stage which follows the transistor 47. A base terminal of the transistor 48 is connected to the collector terminal of the transistor 47. The base terminal of the transistor 48 is also connected to the ground through a resistor R1. An emitter terminal of the transistor 48 is provided with a level shift diode D1. An anode terminal of the diode D1 is connected to the emitter terminal of the transistor 48 and a cathode terminal thereof is connected to a base terminal of an npn-type transistor 49. The level shift diode D1 is used to shift the level at the emitter terminal of the transistor 48 towards a lower level to thereby apply an appropiate bias to the transistor 49. Although one level shift diode D1 is employed in the illustrated embodiment, a plurality of level shift diodes may be used for obtaining a necessary level shift.

The transistor 49 is provided for discharging the charge stored in the load capacitor $C_L$ when an input e is increased and thereby the transistor 49 is turned ON. Base and emitter terminals of the transistor 49 are connected to an negative power supply source $-V$ through resistors R2 and R3.

Now, the operation of the circuit of FIG. 3 is described with reference to FIGS. 4(A) through 4(F).

First, a description is given of a case where the input B is fixed to "L" and only the input "A" is changed. When the level of the input A is "H", the transistor 41 is switched ON and the transistor 43 is switched OFF. Therefore, the output a of the transistor 43 is set at "H". Therefore, although the transistors 44 and 45 are set in ON, the differential amplifier composed thereof does not operate, because the outputs b and c are at the same potential level. As a result, the output A+B is set at a potential which is determined by the transistor 44. That is, the output A+B is set at "H". As will be described later, at this time, it is possible to set, in a fixed state, a value of a current which is derived from the load capacitor $C_L$ and passes through the transistor 49 to zero.

Figure 4:
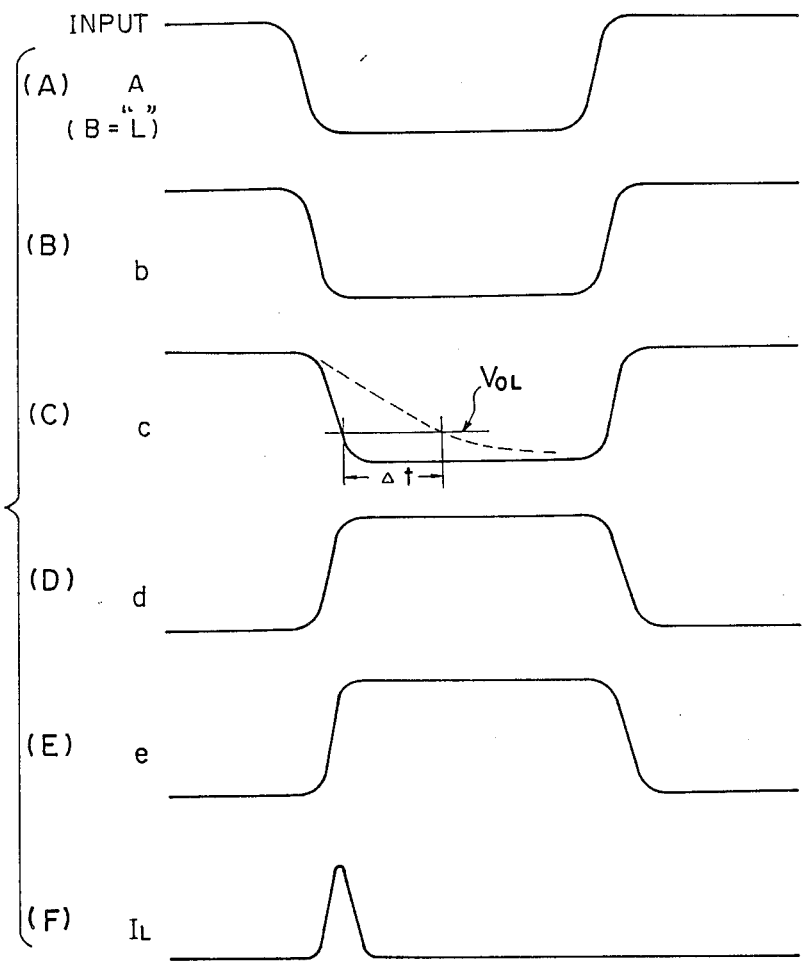
FIGS. 4(A) through 4(F) are views showing waveforms at different parts of the circuit of FIG. 3.

Next, when the input A is switched from "H" to "L", the transistor 41 is turned OFF and the transistor 43 is turned ON. Therefore, the level of the output a at the collector terminal of the transistor 43 is decreased. Correspondingly, the transistors 44 and 45 are turned OFF, and therefore levels of the emitter outputs c and b are decreased. In this case, the level of the output c is slowly decreased, compared with the level of the output b, because the load capacitor $C_L$ is connected to the emitter terminal of the transistor 44. As a result, a difference in potentials between the base terminals of the transistors 46 and 47 occurs, and the differential amplifier composed thereof starts operating. At this time, the ON state of the transistor 46 is accelerated, and therefore the charge stored in the load capacitor $C_L$ begins to discharge through the transistor 46. On the other hand, the above-described potential difference rapidly turns the transistor 47 OFF and thereby the output signal d obtained at the base terminal of the transistor 48 is increased. Therefore, a driving current which passes through the transistor 48 and the base potential of the transistor 49 is increased, so that the transistor 49 is turned ON (that is, the current $I_L$ is increased). As a result, the charge stored in the load capacitor $C_L$ is rapidly discharged through the transistor 49. In this manner, as shown in FIG. 4(C), the high-to-low switching time of the present embodiment is faster by a time t than that for the conventional circuit. In FIG. 4(C), a solid line denotes the emitter output c of the embodiment, and a broken line denotes the emitter output for the circuit of FIG. 2. Also, $V_{OL}$ denotes a potential level near the low level L. It is to be noted that the transistor 49 is maintained in ON only when the emitter output c is greater in level than the emitter output b. Therefore, when the emitter output c becomes identical in level to the emitter output b by the decrease of the emitter output c, the current $I_L$ is stopped to pass through the transistor 49.

It is to be noted that the charge stored in the load capacitor $C_L$ is discharged through the transistor 46 and is then discharged through the transistor 49. Therefore, the switching is very fast.

Subsequently, when the input A is changed from "L" to "H", the transistors 41 and 43 are turned ON and OFF, respectively, so that the output a is increased in level. Therefore, the transistor 44 is turned ON, and thereby the OR logic output A+B is switched from "L" to "H". At this time, the load capacitor $C_L$ is driven by the transistor 44, so that it can be rapidly charged. When the transistor 46 is turned ON, the transistor 47 has been turned OFF, and also the transistor 49 has been turned OFF. Thus, this prevents a specific transitional current from passing through the transistor 49.

The circuit configuration of FIG. 3 can satisfy, at the same time, two requirements of low power consumption at the stationary state of the circuit and the rapid change of the output from "H" to "L", by adjusting resistances of the resistors R1 and R3 and the current Ic which passes through the constant current supplying source 53. This is described below.

The current passing through the resistor R1 in the stationary state is represented as $I_l = \frac{1}{2}Ic$, and the current $I_L$ can be expressed as follows:

$$I_L = (V - 3V_{BE} - R1 \times I_1)/R3 \qquad (1)$$
$$= (V - 3V_{BE} - R1/2Ic)/R3$$

where V denotes the negative power supply voltage, $V_{BE}$ denotes a forward direction voltage between the base and emitter of each of the transistors 48, 49 and diode D1. And, R3 denotes the resistance of the resistor R3.

Also when the output A+B is switched from "H" to "L", the output b of the transistor 45 is decreased before the output c is changed. Therefore, the transistor 47 is turned OFF and thereby $I_1 \approx 0$ at the transitional time. Consequently, the current $I_L$ can be written from equation (1) as follows:

$$I_L = (V - 3V_{BE})/R3 \qquad (2)$$

Now assuming that $I_L$ is set so as to become 0 at the stationary state, the current $I_L$ can be written from the equation (1) as follows:

$$I_L = (V - 3V_{BE} - R1/2Ic)/R3 = 0$$

and therefore the following relationship is obtained:

$$V - 3V_{BE} - 1/(2 \times R1 \times Ic) \qquad (3)$$

Consequently, the following relationship is obtained from equations (2) and (3):

$$I_L = (R1 \times Ic)/(2 \times R3) \qquad (4)$$

It can be seen from equation (4) that an increased driving current $I_L$ can be obtained by increasing the resistance R1 or reducing the resistance R3. Selection of either one of the increase of the resistance R1 and the reduction of the resistance R3 is a design consideration.

With the circuit configuration of FIG. 3, speeding-up of variation in the output of the emitter follower circuit can be obtained by adjusting resistance of the resistor R1 and/or resistor R3. Therefore, an easy adjustment for obtaining desired characteristics is possible, compared to the conventional circuits.

In the circuit of FIG. 3, although the negative power supply voltage −V is usually set to be different from the emitter supply voltage $V_{EE}$, it may be set at a voltage identical to the voltage $-V_{EE}$ if it is permitted.

Figure 5:
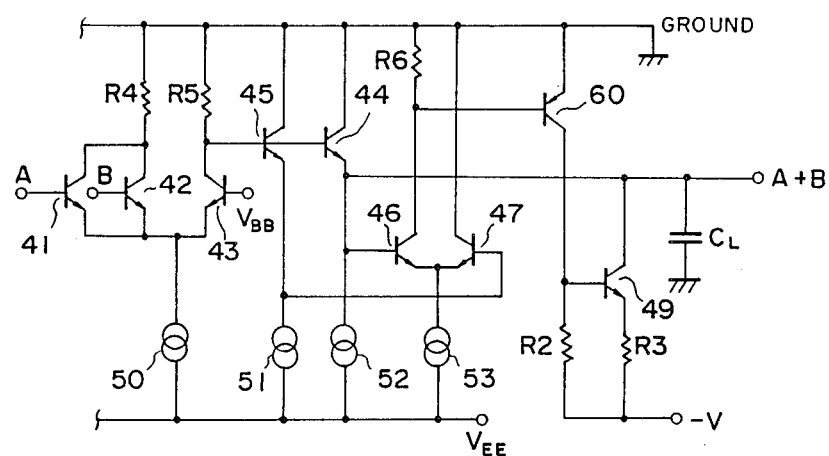
FIG. 5 is a circuit diagram of another embodiment of the present invention.

A description is given of another embodiment of the present invention with reference to FIG. 5, in which the same elements as those in FIG. 3 are indicated by the same reference numerals as those therein. The circuit of FIG. 5 is different from that of FIG. 3 in that a pnp-type transistor 60 is employed in place of the npn-type transistor 48 in FIG. 3. Correspondingly, a base terminal of the transistor 60 of the emitter follower is connected to the collector terminal of the transistor 46. It should be noted that there is no level shift diode such as the diode D1 in the circuit configuration of FIg. 5. This circuit having no level shift diode D1 is described in detail later.

In operation, when an input A is changed from "H" to "L", a current passes through a transistor R6 and thereby the base potential of the transistor R6 and thereby the base potential of the transistor 60 becomes approximately 0.6 (V) lower than the emitter thereof. Therefore, the transistor 60 is turned ON and supplies the transistor 49 with a base current. Accordingly, the transistor 49 is turned ON, so that the charge stored in the load capacitor $C_L$ is rapidly discharged through the transistor 49. In this manner, the transistor 49 is driven by the current from the transistor 60. When the output A+B changes from "L" to "H", the transistor 46 is swichted to the OFF state, so that the pnp-type transistor 60 is switched to OFF state. In this state, the base level of the transistor 49 is completely switched to the L level so as to cause the transistor 49 to be OFF state. As described above, since the pnp-type transistor 60 switches between ON and OFF, the base potential level of the transistor 49 changes between a very high level (almost identical to the ground level) and a very low level (almost identical to −V). Therefore, a level shift diode for supplying a suitable bias to the transistor 49 is unnecessary. Therefore, the operation of the transistor 49 is not affected by the variation of voltage −V, and is more reliable than the circuit of FIG. 3.

Further, all of the charge stored in the load capacitor $C_L$ are discharged through the transistor 49, whereas in the circuit of FIG. 3, a part of the charge is discharged through the transistor 46 at the commencement of the switching operation. From this viewpoint, the switching speed of the output from "H" to "L" in the circuit of FIG. 5 is slightly slower than that for the circuit of FIG. 3.

The present invention is not limited to the embodiments, but various variations and modification may be made without departing from the scope of the present invention. The embodiments described above are with respect to cases where the present invention is applied to ECL circuits. However, the present invention is not limited to the application of ECl circuits. That is, in place of transistors 41, 42 and 43, an aribitrary logic circuits may be positioned.

I claim:

1. A semiconductor integrated circuit having an emitter follower circuit coupled with an output of a logic circuit, comprising:
   a first emitter follower means for receiving an output signal of a logic circuit, an output signal obtained at an emitter output of the first emitter follower means forming a finalized output signal of the logic circuit;
   second emitter follower means for receiving the output signal of the logic circuit, said first and second emitter follower means being supplied with the same output signal of the same phase derived from said logic circuit;
   detecting means, connected to said first and second emitter follower means, for detecting a difference in level between the output signal of the first emitter follower means and an output signal of the second emitter follower means; and
   driving means, connected to said detection means, for driving a load capacitance, coupled with the emitter output of the first emitter follower means, during a period when the detecting means detects the difference.

2. A semiconductor integrated circuit having an emitter follower circuit coupled with an output of a logic circuit, comprising:
   a first emitter follower means for receiving an output signal of a logic circuit, an output signal obtained at an emitter output of the first emitter follower means forming a finalized output signal of the logic circuit;
   second emitter follower means for receiving the output signal of the logic circuit, said first and second emitter follower means being supplied with the same output signal of the same phase derived from said logic circuit;
   detecting means, connected to said first and second emitter follower means, for detecting a difference in level between the output signal of the first emitter follower means and an output signal of the second emitter follower means;
   first driving means, connected to said emitter output of said first emitter follower means, for driving a load capacitance, coupled with the emitter output of the first emitter follower means, during a period when the detecting means detects the difference; and
   second driving means, connected to said detecting means and said first driving means, for driving the first driving means in response to the difference detected by the detecting means.

3. A semiconductor integrated circuit as claimed in claim 2, wherein the first emitter follower means comprises an npn-type transistor, a base terminal of which is supplied with the output signal of the logic circuit, and an emitter terminal thereof is connected to the detecting means, and wherein the second emitter follower means comprises an npn-type transistor, a base terminal of which is supplied with the output signal of the logic circuit, and an emitter terminal thereof is connected to the detecting means.

4. A semiconductor integrated circuit as claimed in claim 2, wherein the detecting means comprises a differential amplifier.

5. A semiconductor integrated circuit as claimed in claim 4, wherein the differential amplifier comprises a first npn-type transistor and a second npn-type transistor, and wherein a base terminal of the first transistor receives the output signal of the first emitter follower means, and a base terminal of the second transistor receives the output signal of the second emitter follower means, and wherein emitter terminals of the first and second transistors are supplied with a constant current supply source, a collector terminal of the first transistor is connected to the output of the first emitter follower means, and a collecter terminal of the second transistor is connected to a positive power supply source.

6. A semiconductor integrated circuit as claimed in claim 2, wherein the second driving means comprises an npn-type transistor and a resistor, a base terminal of which is connected to an output of the detecting means, and wherein an emitter terminal of the transistor is connected to the first driving means, and a collector terminal thereof is connected to a positive power supply source and to the base terminal through the resistor.

7. A semiconductor integrated circuit as claimed in claim 6, wherein the second driving means further comprises a level shift diode, an anode terminal of which is connected to the emitter terminal of the transistor of the second driving means, and a cathode terminal thereof is connected to an input of the first driving means.

8. A semiconductor integrated circuit as claimed in claim 2, wherein the first driving means comprises an npn-type transistor and two resistors, a base terminal of which is connected to an output of the second driving means, and wherein a collector terminal thereof is connected to the output of the first emitter follower means, and base and emitter terminals thereof are connected to a negative power supply source through the respective resistors.

9. A semiconductor integrated circuit as claimed in claim 3, wherein the differential amplifier comprises a first npn-type transistor and a second npn-type transistor, and wherein a base terminal of the first transistor receives the output signal of the first emitter follower means, and a base terminal of the second transistor receives the output signal of the second emitter follower means, and wherein emitter terminals of the first and second transistors are supplied with a constant current supply source, a collector terminal of the first transistor is connected to the output of the first emitter follower means, and a collector terminal of the second transistor is connected to a positive power supply source through a resistor, and wherein the second driving means comprises an npn-type transistor and a level shift diode, a base terminal of which is connected to the collector terminal of the second transistor of the detecting means, and wherein an emitter terminal of the transistor of the second driving means is connected to the first driving means through the level shift diode, and a collector terminal of the transistor of the second driving means is connected to a positive power supply source and to the base terminal through the resistor.

10. A semiconductor integrated circuit as claimed in claim 2, wherein the second driving means comprises a pnp-type transistor and a resistor, a base terminal of which is connected to an output of the detecting means, and wherein a collector terminal thereof is connected directly to the first driving means, and an emitter terminal thereof is connected to a positive power supply source and also to the base terminal thereof through the resistor.

11. A semiconductor integrated circuit as claimed in claim 4, wherein a differential amplifier comprises a first npn-type transistor and a second npn-type transistor, and wherein a base terminal of the first transistor receives the output signal of the first emitter follower means, and a base terminal of the second transistor receives the output signal of the second emitter follower means, and wherein emitter terminals of the first and second transistors are supplied with a constant current supply source, a collector terminal of the first transistor is connected to the output of the first emitter follower means, and a collector terminal of the second transistor is connected to a positive power supply source, and wherein the second driving means comprises a pnp-type transistor and a resistor, a base terminal of which is connected to an output of the first transistor of the detecting means, and wherein a collector terminal thereof is connected directly to the first driving means, and an emitter terminal thereof is connected to a positive power supply source and also to the base terminal thereof through the resistor.

12. A semiconductor integrated circuit as claimed in claim 2, wherein the logic circuit is an emitter coupled logic circuit.

* * * * *